(12) United States Patent  (10) Patent No.: US 8,089,466 B2
Smith  (45) Date of Patent: Jan. 3, 2012

(54) SYSTEM AND METHOD FOR PERFORMING OPTICAL NAVIGATION USING A COMPACT OPTICAL ELEMENT

(75) Inventor: George E. Smith, Sunnyvale, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 347 days.

(21) Appl. No.: 12/388,164

(22) Filed: Feb. 18, 2009

(65) Prior Publication Data

US 2010/0207011 A1   Aug. 19, 2010

(51) Int. Cl.
G06F 3/033 (2006.01)
G06M 7/00 (2006.01)
(52) U.S. Cl. ........................ 345/166; 250/221
(58) Field of Classification Search ................. 250/221; 345/165, 166
See application file for complete search history.

(56) References Cited

U.S. PATENT DOCUMENTS

| 7,688,309 B2 * | 3/2010 | Theytaz et al. ............... 345/166 |
| 2006/0171039 A1 * | 8/2006 | Smith et al. ................... 359/720 |
| 2007/0052684 A1 | 3/2007 | Gruhlke et al. |
| 2007/0222756 A1 * | 9/2007 | Wu et al. ....................... 345/165 |
| 2008/0088853 A1 | 4/2008 | Hwang et al. |
| 2008/0174782 A1 | 7/2008 | Lin |
| 2008/0204761 A1 | 8/2008 | Itagaki |

FOREIGN PATENT DOCUMENTS

EP  1918674 A1  5/2008

* cited by examiner

Primary Examiner — Thanh X Luu
Assistant Examiner — Renee Naphas

(57) ABSTRACT

A system and method for performing optical navigation uses an illumination optical element positioned between a light source and a navigation surface to bend and collimate a beam of light from the light source, which may be originally emitted in a direction normal to the navigation surface. The illumination optical element includes a concave surface to receive the beam of light from the light source and a convex surface to transmit the beam of light from the illumination optical element toward the navigation surface. The beam of light incident on the navigation surface produces light, which is received at an image sensor array to capture frames of image data for displacement estimation.

19 Claims, 6 Drawing Sheets

SYSTEM AND METHOD FOR PERFORMING OPTICAL NAVIGATION USING A COMPACT OPTICAL ELEMENT

BACKGROUND OF THE INVENTION

Optical navigation systems detect relative movements between the optical navigation systems and target or navigation surfaces to perform tracking operations. An optical navigation system uses a light source, such as a light-emitting diode or a laser diode, to provide illumination light on a navigation surface and an image sensor to successively capture frames of image data in response to the illumination light reflected off the navigation surface, which may be specularly reflected light or scattered light. The optical navigation system compares the successive frames of image data and estimates the relative displacements or movements between the optical navigation system and the navigation surface based on the comparison between the current frame of image data and a previous frame of image data. The optical navigation system is able to track the relative movements between the optical navigation system and the navigation surface by continuously capturing and comparing frames of image data.

Optical navigation systems are commonly used in optical computer mice to track the lateral movements of the mice relative to the navigation surfaces on which the mice are manually manipulated. In a typical optical computer mouse, an illumination lens is used to focus and/or collimate the light from the light source onto a navigation surface and an imaging lens is used to focus light reflected from the navigation surface onto the image sensor. The illumination lens and the imaging lens may be implemented as a single optical component. Conventional optical components used in optical computer mice limit the size reduction of the optical navigation systems, which may be preferred in certain applications.

Thus, there is a need for a system and method for performing optical navigation that uses a more compact optical element to reduce the overall size of the system.

SUMMARY OF THE INVENTION

A system and method for performing optical navigation uses an illumination optical element positioned between a light source and a navigation surface to bend and collimate a beam of light from the light source, which may be originally emitted in a direction normal to the navigation surface. The illumination optical element includes a concave surface to receive the beam of light from the light source and a convex surface to transmit the beam of light from the illumination optical element toward the navigation surface. The beam of light incident on the navigation surface produces light, which is received at an image sensor array to capture frames of image data for displacement estimation.

A system for performing optical navigation in accordance with an embodiment of the invention includes an illumination optical element and an image sensor array. The illumination optical element has a concave surface on a first side and a convex surface on a second side. The first and second sides are opposite sides of the illumination optical element. The illumination optical element is orientated such that that a beam of light is received at the concave surface and transmitted into the illumination optical element and the beam of light is emitted out of the convex surface toward a navigation surface. The image sensor array is positioned to receive light from the beam of light incident on the navigation surface. The image sensor array is configured to capture frames of image data from the received light for displacement estimation. The system may also include a light source configured to emit the beam of light.

A method for performing optical navigation in accordance with an embodiment of the invention comprises emitting a beam of light from a light source, receiving the beam of light at a concave surface of an illumination optical element, deflecting the beam of light at the concave surface of the illumination optical element by a first angle, refracting the beam of light from the concave surface at a convex surface of the illumination optical element by a second angle, including collimating the beam of light at the convex surface, emitting the beam of light out of the convex surface toward a navigation surface, and receiving light from the beam of light incident on the navigation surface at an image sensor array to capture frames of image data from the received light for displacement estimation.

Other aspects and advantages of the present invention will become apparent from the following detailed description, taken in conjunction with the accompanying drawings, illustrated by way of example of the principles of the invention.

DETAILED DESCRIPTION

Figure 1:
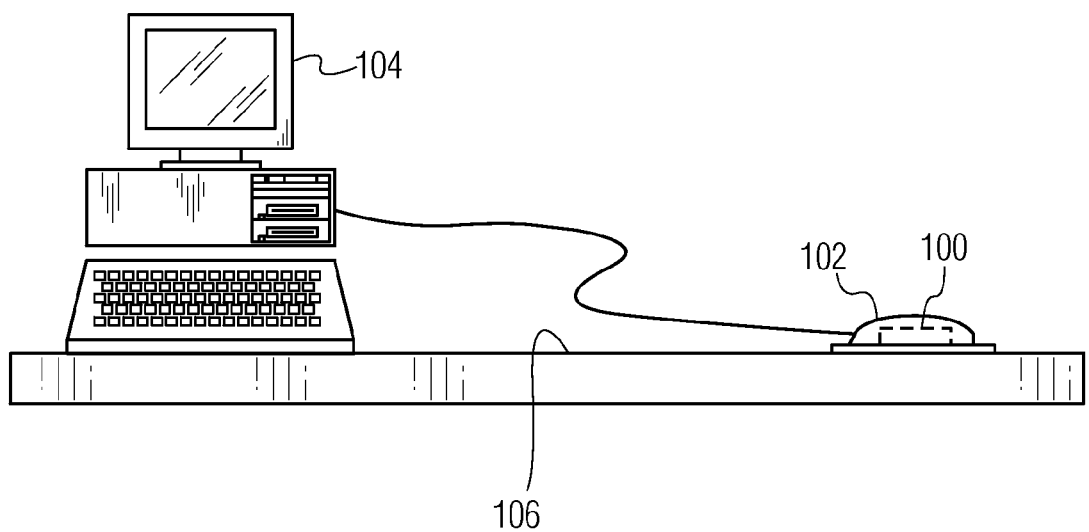
FIG. 1 shows an optical navigation system included in an optical computer mouse in accordance with an embodiment of the invention.

With reference to FIG. 1, an optical navigation system 100 in accordance with an embodiment of the invention is described. As shown in FIG. 1, the optical navigation system 100 is included in an optical computer mouse 102, which is connected to a computer 104. In other embodiments, the optical computer mouse 102 may be wirelessly connected to the computer 104. In this implementation, the optical navigation system 100 is used to optically track the movements of the optical mouse 102 as the optical mouse is manipulated over a navigation or target surface 106 by a user to control a cursor displayed on the computer 104. However, in other implementations, the optical navigation system 100 can be used in different products for various tracking applications.

As described in detail below, the optical navigation system 100 uses a compact optical system to reduce the volume of the system.

Figure 2:
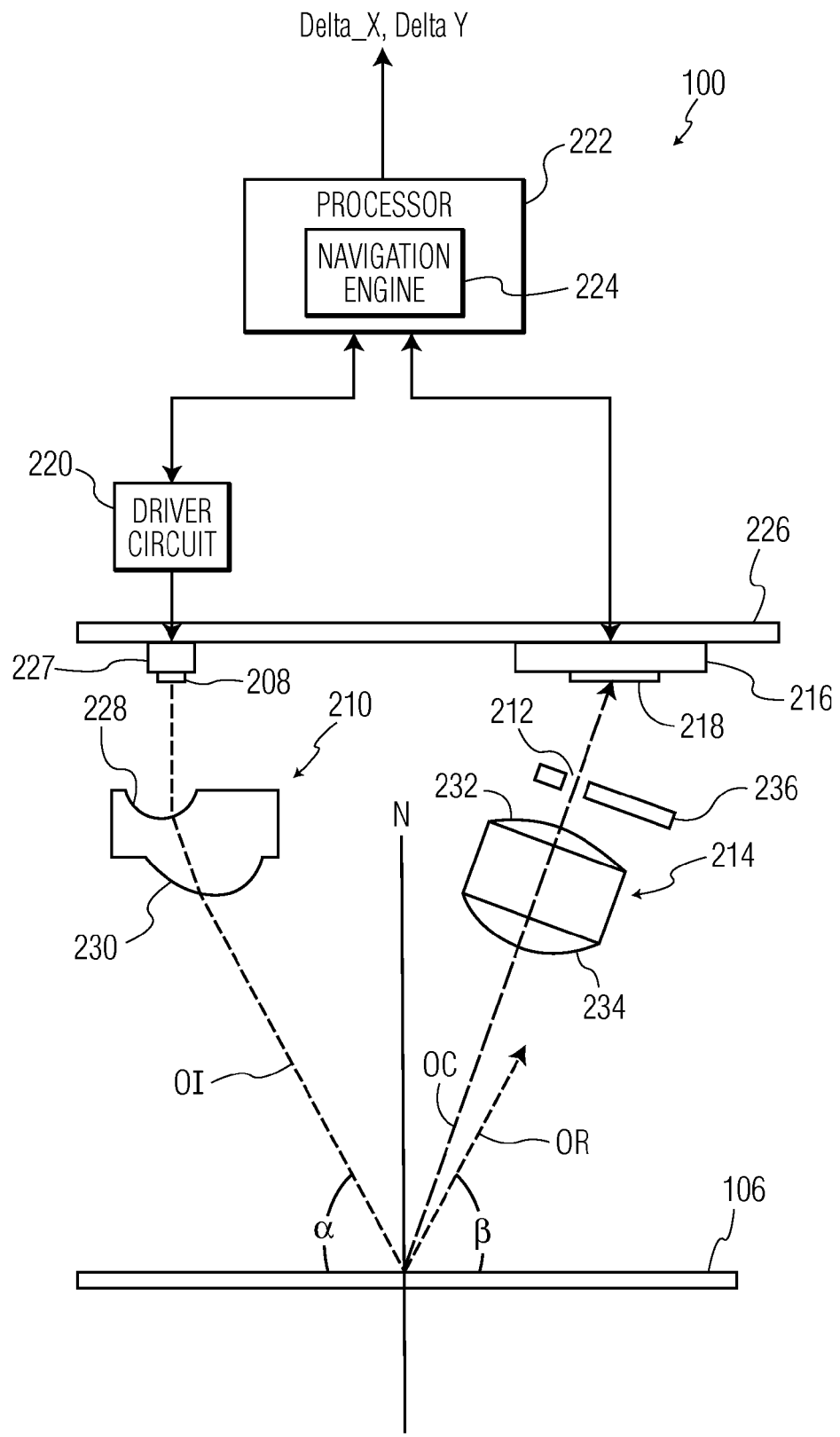
FIG. 2 is a block diagram of the optical navigation system included in the optical mouse of FIG. 1 in accordance with an embodiment of the invention.

As shown in FIG. 2, the optical navigation system 100 in accordance with an embodiment of invention includes a light source 208, an illumination optical element 210, an aperture 212, an imaging optical element 214, an image sensor 216 with an array 218 of photosensitive elements (hereinafter "image sensor array"), a driver circuit 220 and a processor 222 with a navigation engine 224. Although these components of the optical navigation system 100 are shown in FIG. 2 as being separate components, some of these components may be integrated. As an example, the image sensor 216, the driver circuit 220 and the processor 222 with the navigation engine 224 may be integrated into a single integrated circuit chip.

The light source 208 is configured to emit an illumination beam of light in response to an applied driving signal. The light source 208 can be any type of a light emitting device, such as a light-emitting diode (LED) or a laser diode. However, the light source 208 should be a small light source such that the beam of light is small compared to the diameter of a receiving concave surface 228 of the illumination optical element 210, which is described below. As an example, the light source 208 may be a vertical-cavity surface-emitting laser (VCSEL), which generates a coherent laser beam of light. In an embodiment, the light source 208 is positioned to emit a beam of light in a direction normal N to the target surface 106 toward the illumination optical element 210. The light source 208 is activated by the driver circuit 220, which provides driving signals to the light source. In the illustrated embodiment, the light source 208 in the form of a light emitting semiconductor chip is mounted on a substrate 226, which may be a printed circuit board. As illustrated, the light source 208 may be mounted to the substrate 226 on a pedestal 227 so that the light source 208 and the image sensor array 218 lie in the same plane.

The illumination optical element 210 is positioned between the light source 208 and the target surface 106. The illumination optical element 210 includes a concave surface 228 on a side facing the light source 208 and a convex surface 230 on a side facing the target surface 106. Thus, the concave surface 228 and the convex surface 230 are located on opposite sides of the illumination optical element 210. The illumination optical element 210 is configured to receive the beam of light from the light source 208 at the concave surface 228 and to optically manipulate the received beam of light so that the beam of light transmitted from the convex surface 230 of the illumination optical element is incident on the target surface 106 at a desired angle of incidence, $\alpha$, with desired optical characteristics. The optical axis of the illumination beam of light that is incident on the target surface 106 is indicated in FIG. 2 as "OI". As used herein, an "optical axis" of a beam of light is equivalent to the principal or center ray of the beam of light. In an embodiment, the beam of light from the illumination optical element 210 is a collimated beam of light and is incident on the target surface 106 at the desired angle $\alpha$ of approximately thirty (30) degrees from the normal to the target surface. As used herein, the term "approximately" means plus or minus five (5) percent of a given value. However, in other embodiments, the beam of light from the illumination optical element 210 may not be a collimated beam of light and/or is incident on the target surface 106 at a different angle. The illumination optical element 210 will be described in more detail below.

As shown in FIG. 2, the illumination beam of light from the illumination optical element 210 on the target surface 106 produces a specularly reflected beam of light and scattered light. The optical axis of the specularly reflected beam of light is indicated in FIG. 2 as "OR". The angle of reflection of the specularly reflected beam of light is $\beta$, which is equal to the angle of incidence, $\alpha$. The optical axis OR of the specularly reflected beam of light is on the same plane as the optical axis OI of the incident illumination beam of light. The scatter light from the target surface 106 is emitted in different directions.

Figure 3:
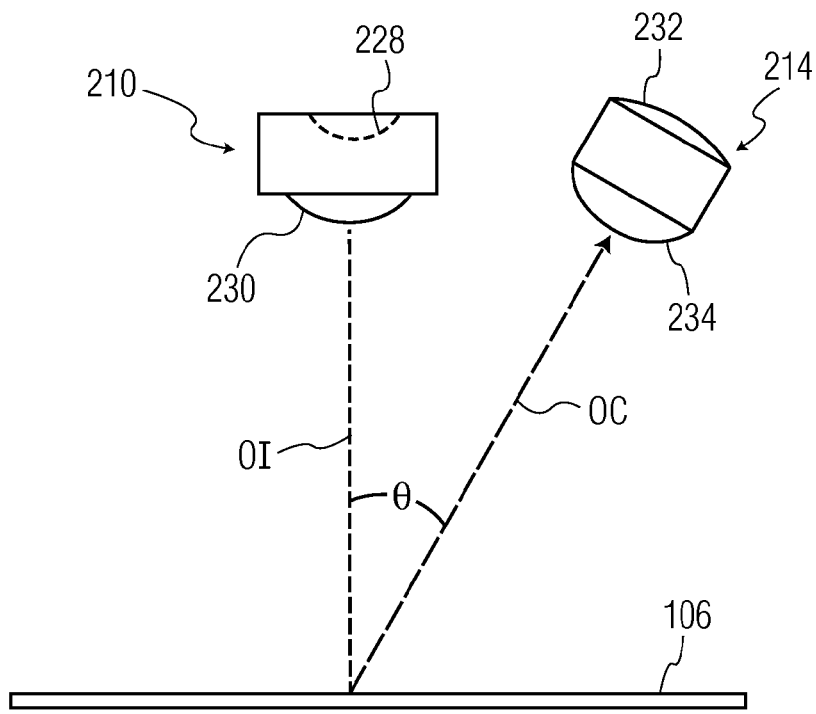
FIG. 3 shows an angle θ between an optical axis OC and the plane defined by optical axes OI and OR with respect to illumination and imaging optical elements of the optical navigation system in accordance with an embodiment of the invention.
Figure 4:
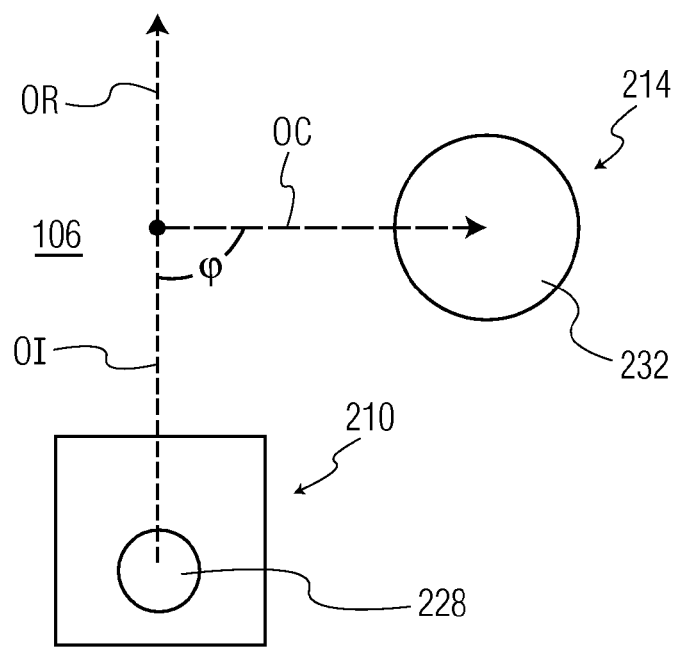
FIG. 4 shows an angle φ between the plane defined by the optical axis OC and an axis normal to a navigation surface and the plane defined by the optical axes OI and OR in accordance with an embodiment of the invention.

The imaging optical element 214 is positioned between the target surface 106 and the image sensor 216 to receive and direct the scattered light from the target surface onto the image senor array 218 of the image sensor. The imaging optical element 214 includes an upper surface 232 and a bottom surface 234. In order to capture some of the scattered light and not the specularly reflected light, the imaging optical element 214 is not positioned on the same plane as the optical axis OR of the specularly reflected beam of light and the optical axis OI of the illumination beam of light. That is, the optical or central axis of the imaging optical element 214 is not positioned on the same plane defined by the optical axis OI of the illumination beam of light and the optical axis OR of the specularly reflected beam of light. The optical axis of the imaging optical element 214 is indicated in FIG. 2 as "OC". Thus, the imaging optical element 214 will receive scatter light traveling near the optical axis OC. In an embodiment, as illustrated in FIG. 3, the imaging optical element 214 is positioned such that an angle $\theta$ between the optical axis OC of the imaging optical element 214 and the plane defined by the optical axes OI and OR is approximately thirty (30) degrees. FIG. 3 is a view from the front of the illumination optical element 210 toward a direction parallel to the plane defined by the optical axes OI and OR. In addition, as shown in FIG. 4, the imaging optical element 214 is positioned such that an angle $\phi$ between the plane defined by the optical axis OC of the imaging optical element 214 and an axis normal to the target surface 106 and the plane defined by the optical axes OI and OR is approximately eighty (80) to one hundred (100) degrees. As an example, the imaging optical element 214 may be positioned such that the angle $\phi$ is approximately ninety (90) degrees.

In an embodiment, the imaging optical element 214 is a refractive or diffractive imaging lens that forms a well-focused image of the navigation surface 106 on the image sensor array 218. The specifics of such imaging lens design (e.g., the curvatures of the upper and bottom surfaces 232 and 234) are known to those skilled in the art, and thus, are not described herein. The imaging optical element 214 may magnify or de-magnify the image of the navigation surface 106 in order to achieve the proper field of view with the size of the image sensor array 218.

In some embodiments, the illumination optical element 210 and the imaging optical element 214 may be integrated into a single optical component formed using an appropriate transparent material, such as glass or plastic, such as polycarbonate.

Further, in some embodiments, the optical navigation system 100 may not include the imaging optical element 214. In such embodiments, the image sensor 216 is positioned such that the center of the image sensor array 218 is aligned with the optical axis OC to directly receive the scattered light from the navigation surface 106. Thus, the image sensor array 218 is positioned along the optical axis OC.

The aperture 212 is used to transmit the scattered light from the navigation surface 106 towards the image sensor array 218 and to block unwanted light. The aperture 212 may be provided by a hole in an opaque wall or plate 236, which may be structural part of the optical navigation system 100 or the optical mouse 102. In the illustrated embodiments, the aperture 212 is positioned between the imaging optical element 214 and the image sensor array 218. However, in other embodiments, the aperture 212 may be positioned between the navigation surface 106 and the imaging optical element 214. The aperture 212 does not need to be rotationally symmetric. In some cases, the aperture 212 may be designed to be shorter in one direction and wider in another direction.

The image sensor 216 is positioned to receive the scattered light from the imaging optical element 214 at the image sensor array 218. In some embodiments, the image sensor 216 is positioned such that the center of the image sensor array 218 is aligned with the optical axis OC, as illustrated in FIG. 2. However, in other embodiments, the image sensor 216 may be positioned such that the center of the image sensor array 218 is not aligned with the optical axis OC. The image sensor array 218 includes photosensitive pixel elements (not shown) that generate signals in response to light incident on the photosensitive pixel elements, where each signal represents the amount or intensity of light incident on a particular element of the image sensor array. These signals in digital form are referred to herein as image data. Thus, the image sensor array 218 is able to simultaneously capture a single frame of image data in response to incident light, i.e., the scattered light from the navigation surface 106, in order to successively capture frames of image data over time. These frames of image data are used for correlation to estimate any relative lateral displacement between the optical navigation system 100 and the navigation surface 106. As an example, the image sensor array 218 may be a charge-coupled device (CCD) image sensor array or a complementary metal oxide semiconductor (CMOS) image sensor array. The number of photosensitive pixel elements included in the image sensor array 218 may vary. As an example, the image sensor array 218 may be a 30×30 array of photosensitive pixel elements, where each pixel element measures 50 μm×50 μm. The image sensor 216 also includes circuitry (not shown), such as an analog-to-digital converter, row and column decoders and an electronic shutter control, to support the image sensor array 218. Since the image sensor array 218 uses scattered light to capture frames of image data of the navigation surface 106, the optical navigation system 100 will operate as long as the navigation surface 106 is a type of surface that produces scattered light, rather than only specularly reflected light.

The processor 222 is configured to control the driver circuit 220 and the image sensor 216 in order to provide the illumination beam of light on the navigation surface 106 and to capture frames of image data in response to the scattered light from the navigation surface. The processor 222 is electrically connected to the driver circuit 220 and the image sensor 216 to provide control signals. The processor 222 provides control signals to the driver circuit 220 to direct the driver circuit to apply driving signals to the light source 208 to activate the light source. The processor 222 also provides control signals to the image sensor 216 to control the accumulation of electrical signals or charges at the photosensitive pixel elements of the image sensor array 218 to produce each frame of image data for correlation.

In the illustrated embodiment, the processor 222 includes the navigation engine 224, which is programmed into the processor. However, in other embodiments, the navigation engine 224 may be a separate component. Thus, the navigation engine 224 can be implemented as software, hardware, firmware, or any combination thereof. The navigation engine 224 operates to correlate the frames of image data captured at different times by the image sensor 216 to estimate any lateral displacement changes between the optical navigation system 100 and the navigation surface 106 with respect to X and Y directions, which are parallel to the navigation surface 106. The process of correlating frames of image data for displacement estimation or navigation is well known, and thus, is not described herein. In an embodiment, the output of the navigation engine 224 includes directional delta X displacement values and directional delta Y displacement values. Each directional displacement value includes a negative or positive sign information, which indicates direction, and an absolute displacement value, which indicates the amount of displacement in that direction. In a particular implementation, the directional delta X and Y displacement values are generated in the form of hex numbers. The navigation engine 224 may also be configured to calculate other properties of the interaction between the optical navigation system 100 and the navigation surface 106, such as whether the optical navigation system has been lifted off the navigation surface.

Figure 5:
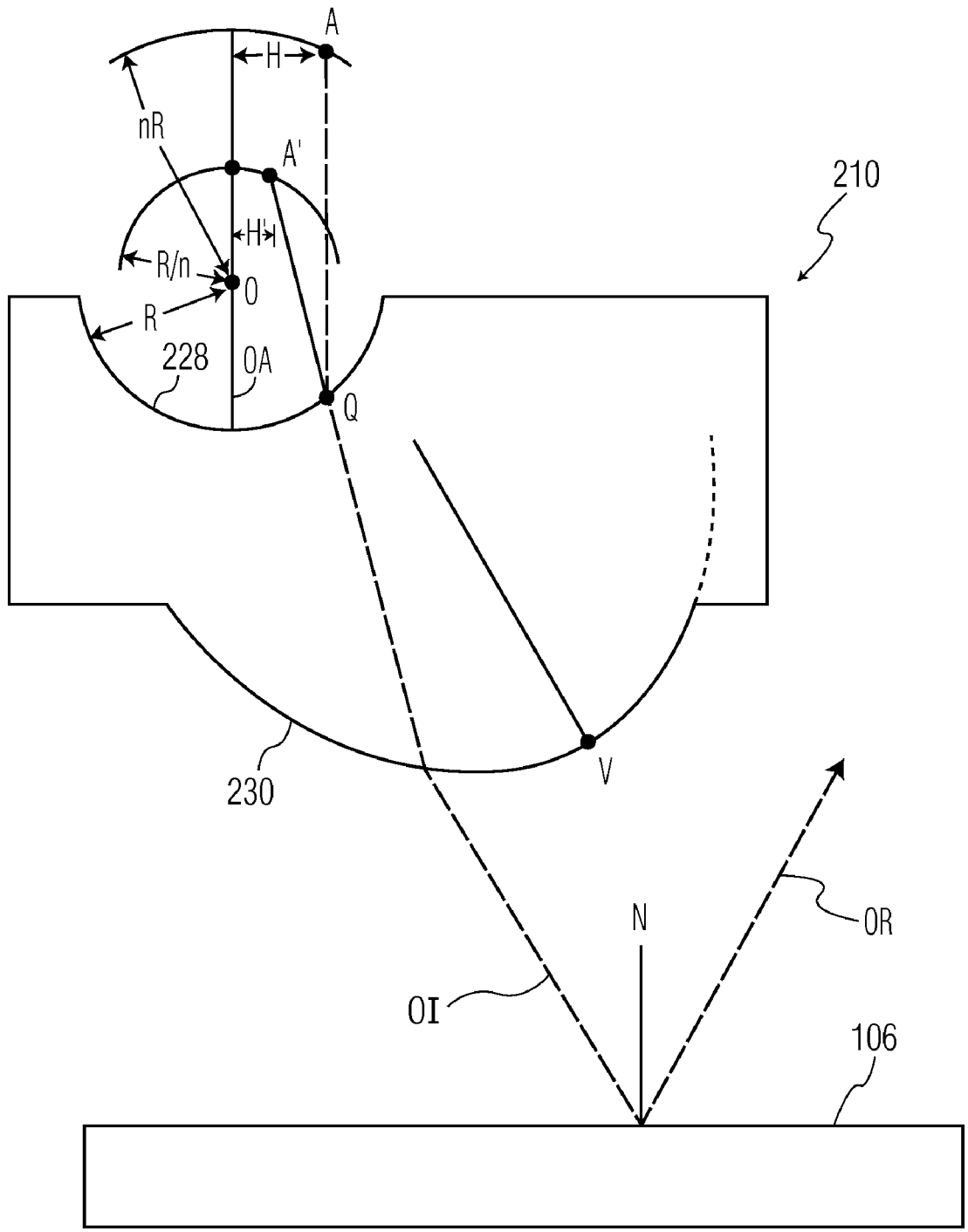
FIG. 5 is a diagram of the illumination optical element in accordance with an embodiment of the invention.

The illumination optical element 210 in accordance with an embodiment of the invention is now described in more detail with reference of FIG. 5. FIG. 5 is a side view of the illumination optical element 210, showing the plane defined by the optical axes OI and OR. The concave surface 228 of the illumination optical element 210 is a negative or inverse Weierstrauss or Aplanatic Sphere, and thus, has similar optical properties of a Weierstrauss or Aplanatic Sphere. The center of the concave spherical surface 228 is located at a point O. The light source 208 is located at a point A, which lies on an nR sphere having a center at the point O, where R is the radius of the concave spherical surface 228 from its center at the point O and n is the index of refraction of the illumination optical element 210. The point A is located at a distance H from the optical axis OA of the concave spherical surface 228, i.e., the optical axis that is normal to the target surface 106. The light source 208 at the point A is orientated so that the principal (center) ray of the emitted beam of light is parallel to the optical axis OA of the concave spherical surface 210 and strikes the concave spherical surface 228 at a point Q. Due to the optical characteristics of the concave spherical surface 228, the principal ray of the beam of light from the light source 208 is deflected at the point Q on the concave spherical surface such that the deflected principal ray of the beam of light appear to have originated from a point A', which is the point on the line defined by the points O and A at a distance of R/n from the point O. Thus, the point A' can be considered as the virtual image point on an R/n sphere having a center at the point O. The point A' lies on the R/n sphere at a distance H' from the optical axis OA, which is equal to $H/n^2$. Thus, the magnification of the concave surface 228 is $H/n^2$. In an embodiment, the parameters n, H and R are chosen such that the principal ray of the beam of light from the light source 208 is deflected at an angle of fifteen (15) degrees from the optical axis OA of the concave spherical surface 228. The concave spherical surface 228 is also designed to expand the beam divergence angle, so that the beam of light from the light source 208 grows faster, which helps compact the optical navigation system 100.

The convex surface 230 of the illumination optical element 210 is a partial surface of an ellipsoid having an eccentricity of 1/n, where again n is the index of refraction of the illumination optical element. The convex ellipsoidal surface 230 is positioned with respect to the concave spherical surface 228 such that the major axis of the ellipsoidal surface intersects the virtual image point A' at one of the foci of the ellipsoidal surface and the other focus is located between the point A' and the vertex V on the major axis of the ellipsoidal surface. One of the characteristics of an ellipsoid having an eccentricity of 1/n is that a ray of light from one of the foci of the ellipsoid traveling off-axis toward the more distant vertex on the major axis of the ellipsoid will be refracted such that the exiting ray of light is parallel to the major axis of the ellipsoid. Thus, the principal ray of the beam of light from the concave spherical surface 228 will be refracted at the ellipsoidal surface 230 to be parallel to the major axis of the ellipsoidal surface. In fact, all the rays of the beam of light from the concave surface 228 will be parallel to the major axis of the ellipsoidal surface 230. Thus, the beam of light from the ellipsoidal surface 230 will be collimated. In an embodiment, the ellipsoidal surface 230 is configured such that the angle of the major axis from the optical axis OA of the concave surface 228 is twice the refracted angle at the concave surface. Thus, if the concave surface 228 is configured to refract the principal ray of the beam of light from the light source 208 by an angle of fifteen (15) degrees from the optical axis OA of the concave surface 228, then the ellipsoidal surface 230 is configured such that the angle of the major axis from the optical axis OA of the concave surface is thirty (30) degrees. In this example, the principal ray of the beam of light from the light source 208 will be refracted by a total of thirty (30) degrees from the original direction, which is normal to the navigation surface 106. As a result, the beam of light from the light source 208 will be a collimated beam of light that strikes the target surface 106 at an angle of thirty (30) degrees from the normal.

With the same deflection angle of the principal ray of the beam of light at each of the surfaces 228 and 230, the principal ray sees a "minimum deviation" condition, which means that slight angular displacements of the illumination optical element 210 result in no or minimal net change in the total beam deflection.

The result is a single element laser collimator that is compact, robust and diffraction limited. This single element provides a compact laser collimator that creates a high quality collimated laser beam at some small angle (e.g., up to forty (40) degrees) deflected from the original laser direction, which enables the laser to be mounted on the same substrate as the image sensor.

In addition, since the optical navigation system 100 uses scattered light to capture frames of image data of the navigation surface 106 rather than specularly reflected light, the optical navigation system can also perform well even if a transparent window (not shown) is placed between the optical navigation system and the navigation surface, which may be desirable in certain applications. However, in some embodiments, the optical navigation system 100 may be configured to use specularly reflected light. In these embodiments, the image sensor array 218 and/or the imaging optical element 214 will be positioned at an appropriate location to receive the specularly reflected light from the navigation surface, e.g., on the plane defined by the optical axes OI and OR.

Figure 6A:
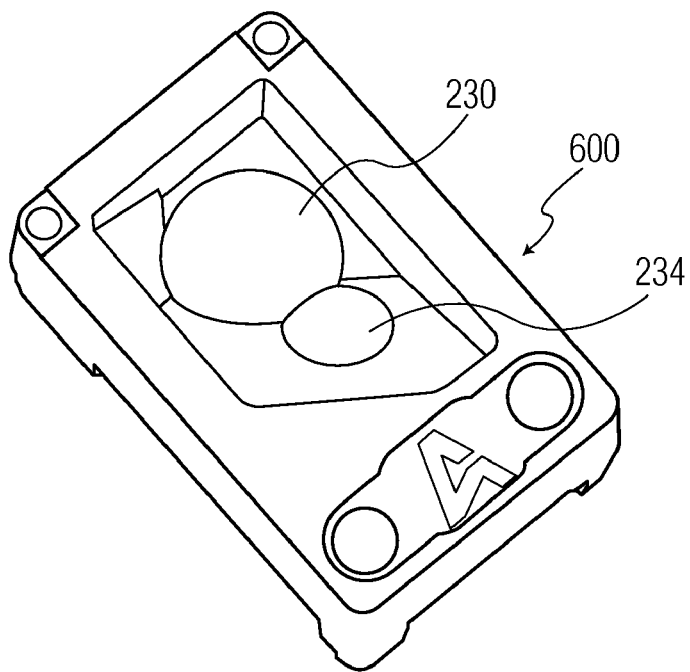
FIG. 6A is a perspective view of an optical component that includes both the illumination and imaging optical elements, which shows the upper side of the optical component, in accordance with another embodiment of the invention.
Figure 6B:
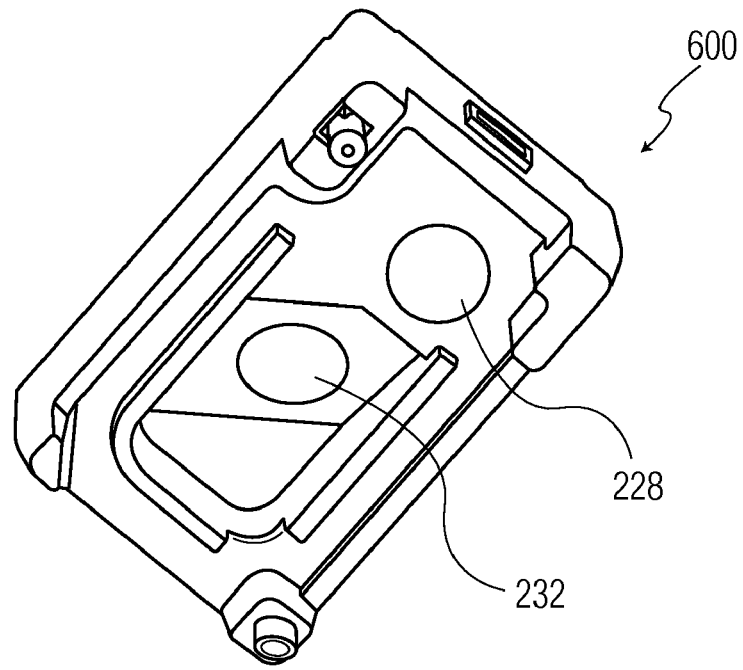
FIG. 6B is another perspective view of the optical component of FIG. 6A, which shows the bottom side of the optical component.

Turning now to FIGS. 6A and 6B, a single optical component 600 that includes both the illumination optical element 210 and the imaging optical element 214 in accordance with an embodiment of the invention is shown. Thus, in this embodiment, the illumination optical element 210 and the imaging optical element 214 are integrated into a single monolithic optical component. FIG. 6A shows the bottom side of the optical component 600, which is the side that faces the navigation surface 106. As shown in FIG. 6A, the bottom side of the optical component 600 includes the ellipsoidal surface 230 of the illumination optical element 210 and the bottom surface 234 of the imaging optical element 214. FIG. 6B shows the upper side of the optical component 600, which is the side that faces the light source 208 and the image sensor 216. As shown in FIG. 6B, the upper side of the optical component 600 includes the concave spherical surface 228 of the illumination optical element 210 and the upper surface 232 of the imaging optical element 214. In an embodiment, the optical component 600 has the following dimensions: length of 12 mm, width of 9 mm, and thickness of 6 mm.

Figure 7:
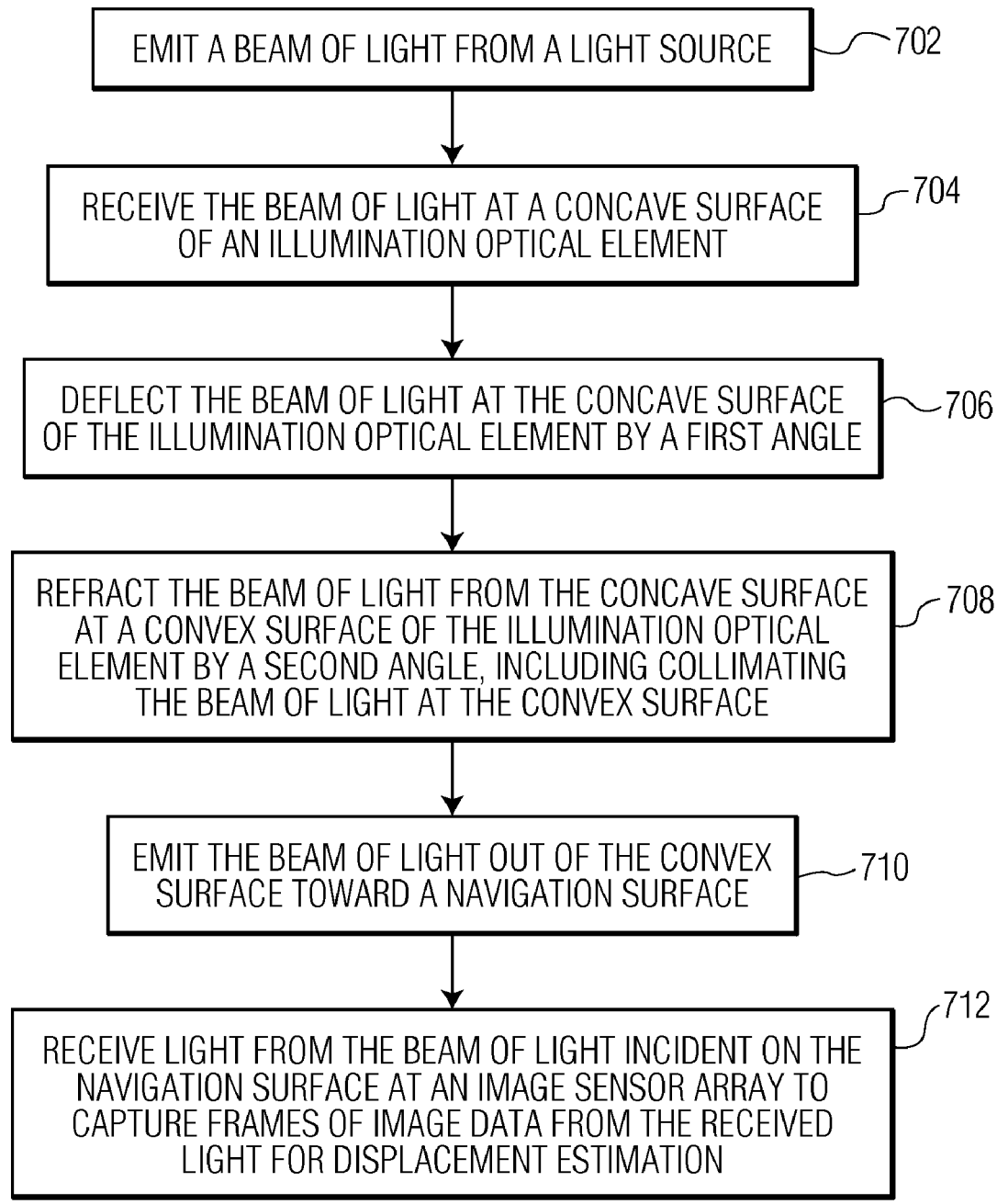
FIG. 7 is a flow diagram of a method for performing optical navigation in accordance with an embodiment of the invention.

A method for performing optical navigation in accordance with an embodiment of the invention is described with reference to a process flow diagram of FIG. 7. At block 702, a beam of light is emitted from a light source. At block 704, the beam of light is received at a concave surface of an illumination optical element. At block 706, the beam of light is deflected at the concave surface of the illumination optical element by a first angle. At block 708, the beam of light from the concave surface is refracted at a convex surface of the illumination optical element by a second angle. In addition, the beam of light is collimated at the convex surface. At block 710, the beam of light is emitted out of the convex surface toward a navigation surface. At block 712, light from the beam of light incident on the navigation surface is received at an image sensor array to capture frames of image data from the received light for displacement estimation.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for performing optical navigation, the system comprising;
   an illumination optical element having a concave surface on a first side and a convex surface on a second side, the first and second sides being opposite sides of the illumination optical element, the illumination optical element being orientated such that that a beam of light is received at the concave surface and transmitted into the illumination optical element and the beam of light is emitted out of the convex surface toward a navigation surface;
   an image sensor array positioned to receive light from the beam of light incident on the navigation surface, the image sensor array being configured to capture frames of image data from the received light for displacement estimation; and
   an imaging optical element positioned between the navigation surface and the image sensor array,
   wherein the imaging optical element is positioned such that the optical axis of the imaging optical element and an axis normal to the navigation surface defines a first plane perpendicular to the navigation surface and an optical axis of the beam of light incident on the navigation surface and an optical axis of the beam of light that is specularly reflected from the navigation surface defines a second plane perpendicular to the navigation surface, where the second plane does not contain the optical axis of the imaging optical element and where the angle between the first plane and the second plane is between approximately eighty to one hundred degrees.

2. The system of claim 1 further comprising a light source configured to emit the beam of light toward the concave surface of the illumination optical element in a direction normal to the navigation surface.

3. The system of claim 2 wherein the concave surface of the illumination optical element is a concave spherical surface to deflect and expand the beam of light.

4. The system of claim 3 wherein the convex surface of the illumination optical element is an ellipsoidal surface.

5. The system of claim 4 wherein the illumination optical element is configured such that the major axis of the ellipsoidal surface intersects a virtual image point that lies on an R/n sphere having a center at the center of the concave surface and on a line between the center of the concave surface and a point from which the beam of light originated, where R is the radius of the concave surface and n is the index of refraction of the illumination optical element.

6. The system of claim 5 wherein the illumination optical element is configured such that the angle between the major axis of the ellipsoidal surface and the normal of the navigation surface is twice the deflection angle of the concave surface.

7. The system of claim 1 wherein the imaging optical element is positioned such that the optical axis of the imaging optical element is tilted by an angle from the normal of the navigation surface that is equivalent to the angle between the major axis of the ellipsoidal surface and the normal of the navigation surface.

8. A method for performing optical navigation, the method comprising;
   emitting a beam of light from a light source;
   receiving the beam of light at a concave surface of an illumination optical element;
   deflecting the beam of light at the concave surface of the illumination optical element by a first angle;
   refracting the beam of light from the concave surface at a convex surface of the illumination optical element by a second angle, including collimating the beam of light at the convex surface;
   emitting the beam of light out of the convex surface toward a navigation surface;
   receiving light from the beam of light incident on the navigation surface at an image sensor array to capture frames of image data from the received light for displacement estimation; and
   receiving the light from the navigation surface at an imaging optical element positioned between the navigation surface and the image sensor array,
   wherein the receiving the light from the navigation surface at the imaging optical element includes receiving the light from the navigation surface at the imaging optical element that is positioned such that the optical axis of the imaging optical element and an axis normal to the navigation surface defines a first plane perpendicular to the navigation surface and an optical axis of the beam of light incident on the navigation surface and an optical axis of the beam of light that is specularly reflected from the navigation surface defines a second plane perpendicular to the navigation surface, where the second plane does not contain the optical axis of the imaging optical element and where the angle between the first plane and the second plane is between approximately eighty to one hundred degrees.

9. The method of claim 8 wherein the emitting the beam of light includes emitting the beam of light from the light source toward the concave surface of the illumination optical element in a direction normal to the navigation surface.

10. The method of claim 9 wherein the concave surface of the illumination optical element is a concave spherical surface to deflect and expand the beam of light.

11. The method of claim 10 wherein the convex surface of the illumination optical element is an ellipsoidal surface.

12. The method of claim 11 wherein the refracting the beam of light includes refracting the beam of light from the concave surface at the convex surface of the illumination optical element in a direction parallel to the major axis of the ellipsoidal surface.

13. The method of claim 12 wherein the refracting the beam of light includes refracting the beam of light from the concave surface at the convex surface of the illumination optical element by the second angle that is twice the first angle.

14. A system for performing optical navigation, the system comprising;
   a light source configured to emit a beam of light toward a navigation surface in a direction normal to the navigation surface;
   an illumination optical element having a concave surface on a first side and a convex surface on a second side, the first and second sides being opposites sides of the illumination optical element, the illumination optical element being orientated such that that the beam of light from the lights source is received at the concave surface and transmitted into the illumination optical element and the beam of light is emitted out of the convex surface toward a navigation surface; and
   an image sensor array positioned to receive light from the beam of light incident on the navigation surface, the image sensor array being configured to capture produce frames of image data from the received light, the frame of image data being used for displacement estimation; and
   an imaging optical element positioned between the navigation surface and the image sensor array,
   wherein the imaging optical element is positioned such that the optical axis of the imaging optical element and an axis normal to the navigation surface defines a first plane perpendicular to the navigation surface and an optical axis of the beam of light incident on the navigation surface and an optical axis of the beam of light that is specularly reflected from the navigation surface defines a second plane perpendicular to the navigation surface, where the second plane does not contain the optical axis of the imaging optical element and where the angle between the first plane and the second plane is between approximately eighty to one hundred degrees.

15. The system of claim 14 wherein the concave surface of the illumination optical element is a concave spherical surface and wherein the convex surface of the illumination optical element is an ellipsoidal surface.

16. The system of claim 15 wherein the illumination optical element is configured such that the major axis of the ellipsoidal surface intersects a virtual image point that lies on an R/n sphere having a center at the center of the concave surface and on a line between the center of the concave surface and a point from which the beam of light originated, where R is the radius of the concave surface and n is the index of refraction of the illumination optical element.

17. The system of claim 1 wherein the angle between the first plane and the second plane is approximately ninety degrees.

18. The method of claim 8 wherein the angle between the first plane and the second plane is approximately ninety degrees.

19. The system of claim 14 wherein the angle between the first plane and the second plane is approximately ninety degrees.

* * * * *